(12) United States Patent
Sakamoto et al.

(10) Patent No.: US 8,130,565 B2
(45) Date of Patent: Mar. 6, 2012

(54) SEMICONDUCTOR DEVICE

(75) Inventors: Tatsuya Sakamoto, Tokyo (JP); Kanji Oishi, Tokyo (JP); Gen Koshita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 51 days.

(21) Appl. No.: 12/820,476

(22) Filed: Jun. 22, 2010

(65) Prior Publication Data

US 2010/0327954 A1 Dec. 30, 2010

(30) Foreign Application Priority Data

Jun. 26, 2009 (JP) ................... 2009-152058

(51) Int. Cl.
*G11C 7/00* (2006.01)
*G11C 17/18* (2006.01)
*G11C 5/14* (2006.01)

(52) U.S. Cl. .............. 365/189.09; 365/189.11; 365/201; 365/225.7; 365/226

(58) Field of Classification Search ............. 365/189.09, 365/189.11, 201, 226
See application file for complete search history.

(56) References Cited

U.S. PATENT DOCUMENTS 5,179,539 A * 1/1993 Horiguchi et al. ............ 365/226
(Continued)

FOREIGN PATENT DOCUMENTS

JP 2005-196936 7/2005

*Primary Examiner* — Trong Phan
(74) *Attorney, Agent, or Firm* — Morrison & Foerster LLP

(57) ABSTRACT

A semiconductor device includes internal voltage generating circuits, a switching circuit, load circuits, a control circuit. Each of the plurality of load circuits is supplied with voltage through the switching circuit from any one of the plurality of internal voltage generating circuits. The control circuit defines connecting combinations by the switch circuit. The control circuit supplies a control signal to the switch circuit, based on the control signal corresponding to the definitions of the connecting combinations. The control circuit allows switching the connecting combinations when the semiconductor device tests in a test mode. The control circuit prohibits switching the connecting combinations in a non-test mode. The switch circuit connects between each of m of the internal voltage generating circuits and each of n of the load circuits through a connecting combination which is selected, based on the control signal, from $m^n$ of the connecting combinations.

16 Claims, 7 Drawing Sheets

U.S. PATENT DOCUMENTS

| | | | |
|---|---|---|---|
| 5,335,203 A * | 8/1994 | Ishii et al. | 365/226 |
| 5,426,616 A * | 6/1995 | Kajigaya et al. | 365/226 |
| 5,459,684 A * | 10/1995 | Nakamura et al. | 365/201 |
| 5,574,691 A * | 11/1996 | Tanida et al. | 365/201 |
| 5,666,317 A * | 9/1997 | Tanida et al. | 365/201 |
| 5,793,685 A * | 8/1998 | Suma | 365/201 |
| 6,075,746 A * | 6/2000 | Ohsawa | 365/189.09 |
| 6,377,508 B1 * | 4/2002 | Tomishima et al. | 365/189.11 |
| 6,424,585 B1 * | 7/2002 | Ooishi | 365/226 |
| 6,628,554 B2 * | 9/2003 | Hidaka | 365/201 |
| 6,816,418 B2 * | 11/2004 | Hidaka | 365/201 |

* cited by examiner

| TERMINAL | (1) T1-T2 T3-T4 | (2) T1-T2 T1-T4 | (3) T3-T2 T3-T4 | (4) T3-T2 T1-T4 |
|---|---|---|---|---|
| LOAD CIRCUIT A | VBB | VBB | VKK | VKK |
| LOAD CIRCUIT B | VKK | VBB | VKK | VBB |
| GATE A | ON | ON | OFF | OFF |
| GATE B | OFF | OFF | ON | ON |
| GATE C | OFF | ON | OFF | ON |
| GATE D | ON | OFF | ON | OFF |

| | GENERATED VOLTAGE UPPER: CHARGE PUMP A LOWER: VOLTAGE DROP CIRCUIT B | SWITCH-CONNECTION | SUPPLY VOLTAGE UPPER: LOAD CIRCUIT LOWER: LOAD CIRCUIT B |
|---|---|---|---|
| DEFAULT | −0.5V<br>−0.3V | T1-T2<br>T3-T4 | −0.5V<br>−0.3V |
| CASE 1 | −0.5V<br>−0.3V | T1-T2<br>T1-T4 | −0.5V<br>−0.5V |
| CASE 2 | −0.5V<br>−0.3V | T3-T2<br>T3-T4 | −0.3V<br>−0.3V |
| CASE 3 | −0.5V<br>−0.3V | T3-T2<br>T1-T4 | −0.3V<br>−0.5V |

|  | GENERATED VOLTAGE<br>UPPER: CHARGE PUMP A<br>LOWER: CHARGE PUMP B | CURRENT SUPPLY ABILITY<br>UPPER: CHARGE PUMP A<br>LOWER: CHARGE PUMP B | SWITCH-<br>CONNECTION | CURRENT SUPPLY ABILITY<br>LOAD CIRCUIT A<br>LOAD CIRCUIT B |
|---|---|---|---|---|
| DEFAULT | −0.5V<br>−0.5V | 10<br>5 | T1-T2<br>T3-T4 | 10<br>5 |
| CASE 4 | −0.5V<br>−0.5V | 10<br>5 | T3-T2<br>T1-T4 | 5<br>10 |

SEMICONDUCTOR DEVICE

BACKGROUND OF THE INVENTION

1. Field of the Invention

The present invention relates to a semiconductor device including a plurality of internal voltage generating circuits.

Priority is claimed on Japanese Patent Application No. 2009-152058, filed Jun. 26, 2009, the content of which is incorporated herein by reference.

2. Description of Related Art

A semiconductor device, such as a DRAM (Dynamic Random Access Memory) which is a typical example of the semiconductor device, generally includes an internal voltage generating circuit that generates a voltage different from a power voltage VDD supplied from the outside and a ground voltage VSS.

For example, the semiconductor device includes a substrate voltage generating circuit (back-bias generator) that applies a negative substrate voltage to a P-type semiconductor substrate in which N-channel MOS transistors are formed. The application of the back bias to the substrate controls the parasitic capacitance between the semiconductor substrate and transistors and threshold voltages (Vt) of the transistors, thereby stabilizing operations of the semiconductor device.

In the semiconductor device, such as a DRAM, when the level of a power voltage VDD is stored in a capacitive element of a memory cell, a selecting transistor connected to the memory cell is turned on and charge is supplied from a bit line to the capacitive element through the selecting transistor. In this case, it is necessary to apply a voltage that is higher than the voltage VDD by the threshold voltage of the selecting transistor to a gate terminal. Therefore, a boosted voltage generating circuit is provided.

Japanese Unexamined Patent Application, First Publication, No. JP-A-2005-196936 discloses a semiconductor device including the internal voltage generating circuit. The semiconductor device disclosed in Japanese Unexamined Patent Application, First Publication, No. JP-A-2005-196936 has a first volatile memory function and a second non-volatile memory function. The semiconductor device replaces volatile memory data with non-volatile memory data. The semiconductor device replaces non-volatile memory data with volatile memory data. The semiconductor device includes a plurality of internal voltage generating circuits that achieves the first function and the second function. The semiconductor device changes an output voltage supplied to a load circuit A according to the function mode. The function mode is the operation modes, such as a volatile (DRAM) access mode to the memory cell and a non-volatile access mode (program, recall, back-up, or erase mode). Therefore, the semiconductor device includes a mode control unit that generates control signals for each function mode and a level selector circuit that connects an internal voltage generating circuit and a load circuit A according to the operation mode on the basis of the control signals from the mode control unit. This can be referred to in FIG. 4 in Japanese Unexamined Patent Application, First Publication, No. JP-A-2005-196936. According to this configurations, in the semiconductor device, after power is turned on, the first function that performs read and write accesses at a high speed is performed to detect the temporary interruption of the power supply, and the function is changed from the first function to the second function to store volatile memory data as non-volatile memory data, thereby preventing the loss of data.

The semiconductor devices (including a semiconductor chip) as manufactured have different characteristics of the internal voltage generating circuit and the load circuit A due to the characteristics of transistors caused by manufacturing conditions, that is, variations on manufacturing processes. In the semiconductor device according to the related art, the correspondence between the internal voltage generating circuit and the load circuit A is determined according to the operation mode, regardless of the characteristics of the load circuits that are different for each semiconductor device. It is difficult to allocate the internal voltage generating circuit that is most suitable for the characteristics of the internal voltage generating circuit and the characteristics of the load circuits.

In the semiconductor device disclosed in Japanese Unexamined Patent Application, First Publication, No. JP-A-2005-196936, switching control between a plurality of internal voltage generating circuits and a plurality of load circuits is performed according to the function mode of the semiconductor device. However, when switching control is performed, the switching conditions are not determined according to the characteristics of each semiconductor device.

In the switching control of each of the manufactured semiconductor devices according to the related art, only a switching operation corresponding to the function mode of the product is performed, and it is difficult to test the characteristics of the internal voltage generating circuits or the load circuits while changing combinations of the voltage generating circuits and the load circuits. Therefore, it is difficult to allocate the load circuit A that is most suitable for the characteristics of the internal voltage generating circuit, or it is difficult to allocate the internal voltage generating circuit that is most suitable for the characteristics of the load circuit A. In the examination test after the semiconductor device is manufactured, in some cases, the semiconductor device does not satisfy an examination test standard due to the characteristics, for example, capability and the amount of leakage current, of the internal voltage generating circuit and the load circuit A. The semiconductor device does not satisfy the examination test standard and is determined to be defective. As a result, product yield is not improved, and it is difficult to reduce manufacturing costs.

In addition, in some cases, the system including the semiconductor device is performed in the high-speed mode or the low-speed mode. For example, a CPU, an MCU, or a DSP device is operated in the high-speed mode or the low-speed mode by, for example, the clock-up of the system defined by the BIOS, and a memory device is operated in the high-speed mode or the low-speed mode according to CAS latency or the frequency of a synchronization signal (external clock signal CLK). In general, when the semiconductor device is operated at a high speed, the leakage current of the semiconductor transistor increases and the noise of the semiconductor chip increases. It is preferable that the internal power voltage generating circuits and the load circuits that are most suitable for the characteristics of the internal voltage generating circuits and the characteristics of the load circuits in each semiconductor device be allocated in relation to the internal operation speed of the semiconductor device. Similarly, the allocation may be performed in relation to the power voltage or the temperature of the semiconductor. This is because the internal operation speed of the semiconductor or the leakage current is changed in relation to the power voltage or the temperature of the semiconductor.

SUMMARY

In one embodiment, a semiconductor device may include, but is not limited to, m of internal voltage generating circuits, a switching circuit, n of load circuits, a control circuit, where m is at least 2, and n is at least 2. Each of the plurality of load circuits is supplied with voltage through the switching circuit from any one of the plurality of internal voltage generating circuits. The control circuit defines connecting combinations by the switch circuit. The control circuit supplies a control signal to the switch circuit, based on the control signal corresponding to the definitions of the connecting combinations. The control circuit allows switching the connecting combinations when the semiconductor device tests in a test mode. The control circuit prohibits switching the connecting combinations in a non-test mode. The switch circuit connects between each of m of the internal voltage generating circuits and each of n of the load circuits through a connecting combination which is selected, based on the control signal, from $m^n$ of the connecting combinations.

In another embodiment, a semiconductor device may include, but is not limited to, m of internal voltage generating circuits, n of load circuits, a switching circuit, and a control circuit, wherein m is at least 2, and n is at least 2. The switching circuit includes a plurality of input terminals that are respectively connected to output terminals of m of the internal voltage generating circuits. The switching circuit includes a plurality of output terminals that are respectively connected to input terminals of n of the load circuits, the switching circuit switching, based on a control signal, connections between the plurality of input terminals and the plurality of input terminals. The control circuit defines connecting combinations by the switch circuit. The control circuit supplies the control signal to the switch circuit. The control signal corresponds to the connecting combination. The control circuit allows switching the connecting combinations when the semiconductor device tests in a test mode. The control circuit prohibits switching the connecting combinations in a non-test mode. Each of n of the load circuits receives a supply of a voltage through the switching circuit from a corresponding one of m of the internal voltage generating circuits. The switch circuit selects a connection combination of $m^n$ of connecting combinations, based on the control signal, to connect between each of the plurality of internal voltage generating circuits and each of the plurality of load circuits.

In still another embodiment, a semiconductor device may include, but is not limited to, a plurality of internal voltage generating circuits, a plurality of load circuits, a switching circuit, and a control circuit. The switching circuit includes a plurality of input terminals that are respectively connected to output terminals of the plurality of internal voltage generating circuits. The switching circuit includes a plurality of output terminals that are respectively connected to input terminals of the plurality of load circuits. The switching circuit selects a connecting combination from a plurality of connecting combinations based on control signals which show connecting relationships between the plurality of internal voltage generating circuits and the plurality of load circuits. The control circuit defines the connecting relationships. The control circuit supplies the control signal corresponding to the definitions of the connecting relationships to the switching circuit. The control circuit allows switching the connecting relationships when the semiconductor device tests in a test mode to switch a first connecting combination to a second connecting combination in the connecting relationships between the plurality of input terminals and the plurality of output terminals, and the control circuit prohibits switching the connecting relationships in a non-test mode.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
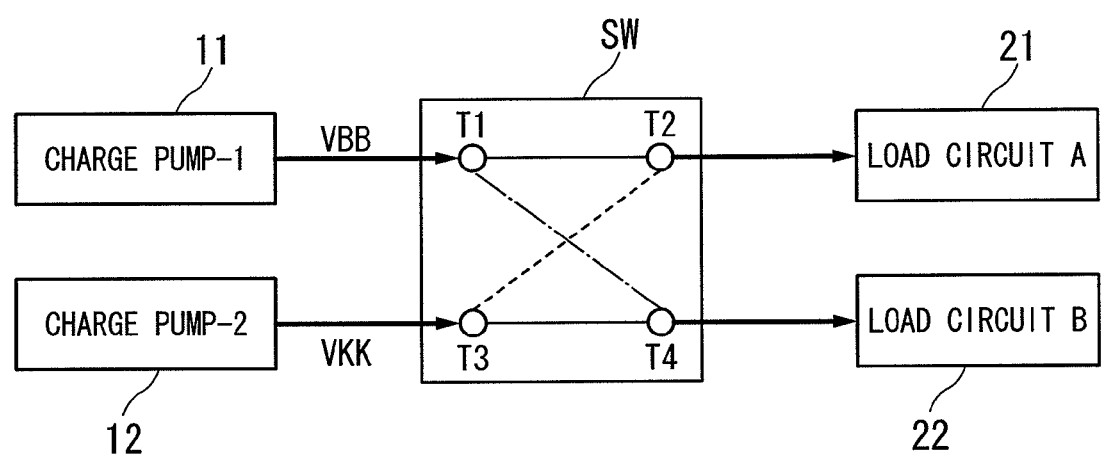
FIG. 1 is a block diagram schematically illustrating a semiconductor device according to an embodiment of the invention.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, m of internal voltage generating circuits, a switching circuit, n of load circuits, a control circuit, where m is at least 2, and n is at least 2. Each of the plurality of load circuits is supplied with voltage through the switching circuit from any one of the plurality of internal voltage generating circuits. The control circuit defines connecting combinations by the switch circuit. The control circuit supplies a control signal to the switch circuit, based on the control signal corresponding to the definitions of the connecting combinations. The control circuit allows switching the connecting combinations when the semiconductor device tests in a test mode. The control circuit prohibits switching the connecting combinations in a non-test mode. The switch circuit connects between each of m of the internal voltage generating circuits and each of n of the load circuits through a connecting combination which is selected, based on the control signal, from $m^n$ of the connecting combinations.

In some cases, the control circuit may include a memory circuit that stores information of the connecting combinations. The memory circuit outputs the control signal that corresponds to the information in the non-test mode. In some cases, the memory circuit has an external terminal that receives the information from outside the semiconductor device. The memory circuit may be a non-volatile memory circuit. The information may include an information that has been decided based on a result of the test for the semiconductor device.

In some cases, the information of the connecting combination may be defined at a time when the semiconductor device gets supplied with power, after the semiconductor device gets supplied with power, at a time of reset command to reset the semiconductor device by hardware or software, and at an initializing time of initializing command to initialize the semiconductor device. The information of the connecting combination is prohibited from being updated in an access time period that the semiconductor device performs a data communication to an external device.

In some cases, the switching circuit switches a first connecting combination to a second connecting combination in the connecting combinations by changing the information.

In some cases, the information of the connecting combinations is decided based on a result of the test to evaluate performances of the load circuit A.

In some cases, the information of the connecting combinations is generated by results of tests to connect between each of n of the load circuits and each of m of the internal voltage generating circuit.

In some cases, outputs from m of the internal voltage generating circuits and inputs into n of the load circuits are any one of positive and negative voltages.

In some cases, m of the internal voltage generating circuits output different voltages from each other.

In some cases, at least one internal voltage generating circuit in m of the internal voltage generating circuits converts an output from another internal voltage generating circuit to generate a voltage.

In some cases, at least two internal voltage generating circuits in m of the internal voltage generating circuits are different from each other in current supply capability.

In another embodiment, a semiconductor device may include, but is not limited to, m of internal voltage generating circuits, n of load circuits, a switching circuit, and a control circuit, wherein m is at least 2, and n is at least 2. The switching circuit includes a plurality of input terminals that are respectively connected to output terminals of m of the internal voltage generating circuits. The switching circuit includes a plurality of output terminals that are respectively connected to input terminals of n of the load circuits, the switching circuit switching, based on a control signal, connections between the plurality of input terminals and the plurality of input terminals. The control circuit defines connecting combinations by the switch circuit. The control circuit supplies the control signal to the switch circuit. The control signal corresponds to the connecting combination. The control circuit allows switching the connecting combinations when the semiconductor device tests in a test mode. The control circuit prohibits switching the connecting combinations in a non-test mode. Each of n of the load circuits receives a supply of a voltage through the switching circuit from a corresponding one of m of the internal voltage generating circuits. The switch circuit selects a connection combination of $m^n$ of connecting combinations, based on the control signal, to connect between each of the plurality of internal voltage generating circuits and each of the plurality of load circuits.

In still another embodiment, a semiconductor device may include, but is not limited to, a plurality of internal voltage generating circuits, a plurality of load circuits, a switching circuit, and a control circuit. The switching circuit includes a plurality of input terminals that are respectively connected to output terminals of the plurality of internal voltage generating circuits. The switching circuit includes a plurality of output terminals that are respectively connected to input terminals of the plurality of load circuits. The switching circuit selects a connecting combination from a plurality of connecting combinations based on control signals which show connecting relationships between the plurality of internal voltage generating circuits and the plurality of load circuits. The control circuit defines the connecting relationships. The control circuit supplies the control signal corresponding to the definitions of the connecting relationships to the switching circuit. The control circuit allows switching the connecting relationships when the semiconductor device tests in a test mode to switch a first connecting combination to a second connecting combination in the connecting relationships between the plurality of input terminals and the plurality of output terminals, and the control circuit prohibits switching the connecting relationships in a non-test mode.

A representative example of the technical spirit for solving the problems of the invention will be described below. However, the claimed content of the invention is not limited to the technical spirit, but is that described in the claims of the invention.

FIG. 1 is a block diagram schematically illustrating a semiconductor device according to the invention. In FIG. 1, the semiconductor device according to the invention includes two internal voltage generating circuits, two load circuits, and a switching circuit SW that is provided between the internal voltage generating circuits and the load circuits.

The two internal voltage generating circuits are, for example, an internal voltage generating circuit 11 (charge pump 1) and an internal voltage generating circuit 12 (charge pump 2). The two load circuits are a load circuit 21 (load circuit A) and a load circuit 22 (load circuit B). The switching circuit SW includes an input terminal T1, an output terminal T2, an input terminal T3, and an output terminal T4.

In the switching circuit SW, the input terminal T1 and the output terminal T2, or the input terminal T1 and the output terminal T4 are connected to each other by control signals (not shown). In the switching circuit SW, the input terminal T3 and the output terminal T2, or the input terminal T3 and the output terminal T4 are connected to each other by control signals (not shown).

An internal voltage (negative voltage VBB) or an internal voltage (negative voltage VKK) is supplied from one of the internal voltage generating circuit 11 and the internal voltage generating circuit 12 to the load circuit 21 by the switching circuit SW. The internal voltage (negative voltage VBB) or the internal voltage (negative voltage VKK) is supplied from one of the internal voltage generating circuit 11 and the internal voltage generating circuit 12 to the load circuit 22 by the switching circuit SW.

A voltage (or a current) that is certainly required to operate the semiconductor device needs to be applied in order to form the load circuits connected to the output terminals of the switching circuit SW, and the internal voltage generating circuit that is connected to one input terminal of the switching circuit SW may not be used according to the connection state of the switching circuit SW. Therefore, it is noted that each output terminal, which is the secondary side of the switching circuit, needs to be connected to one of the input terminals, which are the primary side. On the contrary, each input terminal, which is the primary side of the switching circuit SW, is not necessarily connected to each output terminal, which is the secondary side. When the number (m) of input terminals of the switching circuit SW is 2 and the number (n) of output terminals is 2, there are four ($m^n$) connection conditions, and one of them is selected. When the number (m) of input terminals of the switching circuit SW is 3 and the number (n) of output terminals is 3, there are 27 (m$^n$) connection conditions, and one of them is selected. Therefore, there is also the following setting condition: the number of output terminals>the number of input terminals of the switching circuit SW (for example, the number of input terminals is 3 and the number of output terminals is 4). When the number (m) of input terminals of the switching circuit SW is 3 and the number (n) of output terminals is 4, there are 81 (m$^n$) connection conditions, and one of them is selected. In addition, there is also the following setting condition: the number of output terminals<the number of input terminals of the switching circuit SW.

Figure 2:
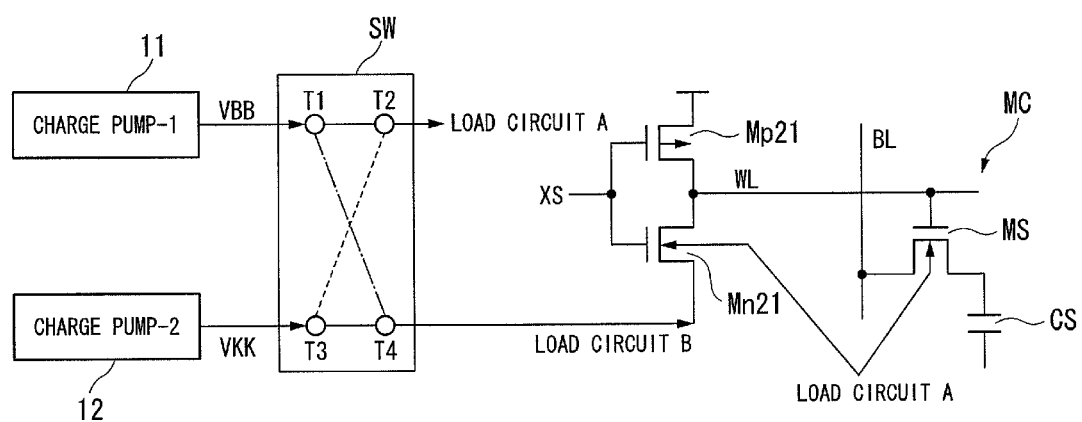
FIG. 2 is a diagram schematically illustrating the load circuit A and the load circuit B in the semiconductor device according to an embodiment of the invention.

FIG. 2 is a diagram schematically illustrating the load circuit A and the load circuit B in the semiconductor device according to the invention. In FIG. 2, the same components as those in FIG. 1 are denoted by the same reference numerals and a description thereof will be omitted. In FIG. 2, a P-channel MOS transistor Mp21 and an N-channel MOS transistor Mn21 form a word driver that drives a word line WL. When an input X selection signal XS is at an L level, the word driver changes the word line WL to an H level and selects a selecting transistor MS of a memory cell MC. When the word driver selects the selecting transistor MS, a memory cell capacitor CS and a bit line BL are connected to each other, and a sense amplifier (not shown) amplifies the difference between the voltages of a pair of the bit lines BL. A plurality of word drivers, a plurality of memory cells, and a plurality of bit lines are provided in the semiconductor device.

The load circuit A is a P-type well layer that supplies a negative back-bias voltage (substrate voltage) to all N-channel MOS transistors of the semiconductor device including the selecting transistor MS and the N-channel MOS transistor Mn21. The back-bias is supplied to the P-type well layer having the N-channel MOS transistor formed therein to control, for example, the parasitic capacitance between the P-type well layer and the N-channel MOS transistor or a threshold voltage (Vt) of the N-channel MOS transistor. In this way, it is possible to stabilize the operation of the circuit.

The load circuit B is the word line WL. A non-selecting voltage is supplied to the word line WL to change the selecting transistor MS of the memory cell to a non-selected state. The load circuit B is connected to a source terminal of the N-channel MOS transistor Mn21. As described above, in the word driver, the voltage of a gate terminal of the N-channel MOS transistor Mn21 that is connected to the selected word line WL is changed to an L level. However, in the remaining non-selected word drivers, the voltage of the gate terminal of the N-channel MOS transistor is maintained at an H level. When the source voltage of the N-channel MOS transistor Mn21 is a ground voltage VSS or a predetermined negative voltage (first voltage) and a bit line side is the source, a gate-source voltage VGS is equal to or less than 0 V in the selecting transistor MS that is connected to the non-selected word driver. Therefore, the memory cell capacitor CS is not connected to the bit line.

However, even though the gate-source voltage VGS of the non-selected memory cell is equal to or less than 0 V, charge leaks to the bit line due to a sub-threshold current when the memory cell capacitor is charged to an H level, and the amount of charge in the memory cell capacitor CS is reduced. In this case, a sense amplifier is likely to determine that the voltage is at an L level during the subsequent read operation. In order to reduce the sub-threshold current, the L-level voltage output from the word driver is lowered. A second negative voltage whose absolute value is less than a predetermined voltage is supplied to the source terminal of the N-channel MOS transistor Mn21 of the word driver to increase the gate-source voltage VGS of the selecting transistor MS connected to the non-selected word in the negative voltage direction.

In the related art in which a fixed voltage is applied to the load circuit A, it is difficult to respond to the characteristics of the load circuit A of each of the manufactured semiconductor devices. For example, when the load circuit A is connected only to the internal voltage generating circuit 11 (when there is only the connection condition between the input terminal T1 and the output terminal T4 of the switching circuit SW), the same internal voltage (negative voltage VBB) is supplied in all of the manufactured semiconductor devices.

As described above, the internal voltage (negative voltage VBB) is supplied to the P well layer having the N-channel MOS transistor formed therein.

When the absolute value of the internal voltage (negative voltage VBB) is small, the sub-threshold current (off leakage current) flows even though all of the N-channel MOS transistors of the semiconductor device are turned off (general non-conductive state). Therefore, a standby current (a power supply current in a non-operation state) of the semiconductor device is large. The semiconductor devices have different sub-threshold currents due to the characteristics of the transistors caused by a manufacturing variation. Therefore, the semiconductor device may not satisfy a current standard determined by product specifications. This is the same when the capability (generated voltage) of the manufactured internal voltage generating circuit 11 is less than a predetermined capability.

In this case, the load circuit A may be connected to another internal voltage generating circuit that supplies a negative internal voltage with a large absolute value. In this case, it is possible to reduce the standby current of each semiconductor device and the semiconductor device may satisfy the current standard.

When the absolute value of the internal voltage (negative voltage VBB) is large, the threshold voltages of all of the N-channel MOS transistors in the semiconductor device increase. Therefore, for example, the operation speed of a logic circuit is likely to be reduced, or the operation margin of a differential amplifying circuit is likely to deteriorate. The semiconductor devices have different threshold voltages due to the characteristics of the transistors caused by a manufacturing variation. The semiconductor device may not satisfy the standard determined by the product specifications, for example, a minimum operation voltage standard.

In this case, when the load circuit A may be connected to another internal voltage generating circuit that supplies a negative internal voltage with a small absolute value. In this case, it is possible to improve the operation speed or the operation margin of each semiconductor device and the semiconductor device may satisfy the minimum operation voltage standard.

That is, a plurality of internal voltage generating circuits that supplies different negative voltages is provided, and a test is performed which sequentially connects the load circuit A to the plurality of internal voltage generating circuits and determines the internal voltage generating circuit satisfying the product standard. Then, in the operation of the manufactured product, the connection of the load circuit A to the internal voltage generating circuit satisfying the standard is fixed. In this way, it is possible to increase product yield.

When the load circuit B is connected only to the internal voltage generating circuit 12 when there is only the connection condition between the input terminal T3 and the output terminal T4 of the switching circuit SW, the same internal voltage (negative voltage VKK) is supplied in all of the manufactured semiconductor devices. As described above, the internal voltage (negative voltage VKK) is supplied to the source terminal of the N-channel MOS transistor Mn21 of the word driver.

When a fixed internal voltage (negative voltage VKK) is supplied, the holding characteristics of the memory cell MC depends on the sub-threshold current characteristics of the selecting transistor MS. The holding characteristics are the charge holding time of the memory cell MC. Even though the memory cell capacitor CS holds an H-level voltage, the voltage is changed to an L level by the leakage current. Therefore, the memory cell capacitor needs to be periodically refreshed within the charge holding time (holding time). However, the refresh period is determined by a standard (holding standard) corresponding to each product.

Since the semiconductor devices have different sub-threshold currents due to the characteristics of the transistor caused by a manufacturing variation, the semiconductor device may not satisfy the holding standard determined by the product specifications. This is the same when the capability (capability of absorbing a generated voltage or the sub-threshold current) of the manufactured internal voltage generating circuit 12 is less than a predetermined capability.

In this case, the load circuit B may be connected to another internal voltage generating circuit that supplies a negative internal voltage with a large absolute value. In this case, it is possible to prevent the sub-threshold current and increase the holding time of each semiconductor device. Therefore, the semiconductor device may satisfy the holding standard.

When the load circuit A is connected to an internal voltage generating circuit that supplies a negative internal voltage with an excessively large absolute value, the holding time is reduced by the GIDL (Gate Induced Drain Leakage) characteristics of the selecting transistor. The GIDL means a phenomenon in which, when a negative bias is applied to the gate terminal and a positive bias is applied to the drain terminal (a terminal close to the memory cell capacitor CS), the electric field is concentrated on an overlap portion between the gate electrode and the drain, a thin depletion layer is formed by the high electric field, and the leakage current flows due to the BTBT (Band To Band Tunneling) of electrons from the valence band to the conduction band.

In this case, a plurality of internal voltage generating circuits that supplies different negative voltages is provided, and a test is performed which sequentially connects the load circuit B to the plurality of internal voltage generating circuits and determines the internal voltage generating circuit satisfying the holding standard. Then, the connection of the load circuit B to the internal voltage generating circuit satisfying the standard is fixed. In this way, it is possible to satisfy the holding standard.

A plurality of internal voltage generating circuits that supplies different negative voltages is provided, and a test is performed which sequentially connects the load circuit B to the plurality of internal voltage generating circuits and determines the internal voltage generating circuit satisfying the holding standard. Then, in the operation of the manufactured product, the connection of the load circuit B to the internal voltage generating circuit satisfying the standard is fixed. In this way, it is possible to increase product yield.

The semiconductor device according to the invention includes m internal voltage generating circuits and n load circuits that are supplied with a voltage from the m internal voltage generating circuits through a switching circuit. The switching circuit performs $m^n$ switching operations (in the above description, m=n=2) between the internal voltage generating circuits and the load circuits. In the semiconductor device according to the invention, in order to allocate the optimal internal voltage generating circuit to each load circuit A to improve the characteristics of each of the manufactured semiconductor devices, the characteristic test is performed while switching the connection between the input and output terminals of the switching circuit, thereby determining the optimal inter-terminal connection information of the switching circuit. Then, the connection between the internal voltage generating circuits and the load circuits in the operation of the product is fixed by the determined inter-terminal connection information, regardless of the operation mode of the product.

Next, exemplary embodiments of the invention will be described in detail with reference to the accompanying drawings.

First Embodiment

Figure 3:
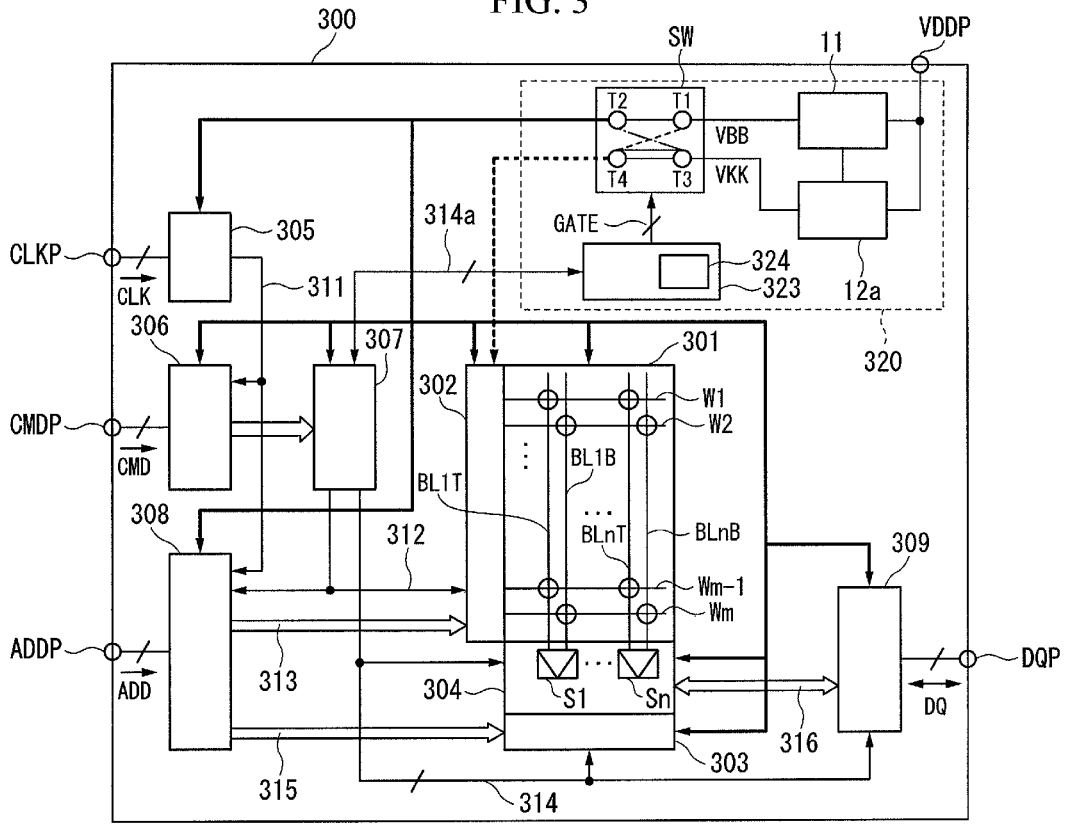
FIG. 3 is a circuit block diagram illustrating a semiconductor device including the internal voltage generating circuits, the switching circuit, and the load circuits.

FIG. 3 is a circuit block diagram illustrating a semiconductor device including the internal voltage generating circuits, the switching circuit, and the load circuits.

In FIG. 3, as the load circuits, the following circuits are used: a memory cell array 301 which is an internal circuit of a DRAM; an X decoder/word driver circuit 302; a Y decoder/Y switching circuit 303; a sense amplifier/IO circuit 304; a control signal generating circuit 305; a command input latch/decoding circuit 306; a control logic circuit 307; an address input latch/decoding circuit 308; and a data input/output circuit 309. In some cases, the semiconductor device 300 includes a build-in-self-test circuit that has a function to test the semiconductor device 300 in the test operation mode.

The memory cell array 301 shown in FIG. 3 includes a plurality of word lines (W1 to Wm), a plurality of bit lines (BL1T to BLnT and BL1B to BLnB), and a plurality of memory cells (m×n memory cells) that is provided at intersections of the word lines and the bit lines.

A plurality of sense amplifiers (S1 to Sn) is provided in the sense amplifier/IO circuit 304, and amplifies the voltage difference between the bit line pairs (BL1T and BL1B) to (BLnT and BLnB).

The internal voltage supply unit 320 supplies a negative voltage VBB or a negative voltage VKK to the circuits. The internal voltage supply unit 320 includes an internal voltage generating circuit 11, an internal voltage generating circuit 12a, a switching circuit SW, and a switch control circuit 323.

The internal voltage generating circuit 11 is supplied with a power voltage VDD from an external power voltage terminal VDDP and generates the negative voltage VBB (for example, −0.5 V) on the basis of the supplied voltage VDD. The internal voltage generating circuit 12a is supplied with the power voltage VDD from the external power voltage terminal VDDP, drops the negative voltage VBB output from the internal voltage generating circuit 11, and generates the negative voltage VKK (for example, −0.3 V).

The P well layer in which the N-channel MOS transistors of all the circuits shown in FIG. 3 are formed corresponds to the load circuit A. The source terminal of each N-channel MOS transistor (which is not shown in FIG. 3, but corresponds to the N-channel MOS transistor Mn21 shown in FIG. 2) of a plurality of word drivers provided in the X decoder/word driver circuit 302 corresponds to the load circuit B.

Therefore, the internal voltage generating circuit 11 is, for example, a charge pump circuit and has a current supply capability of supplying a negative voltage (−0.5 V) to the load circuit A and absorbing a substrate current generating from all of the N-channel MOS transistors of a semiconductor device 300. The internal voltage generating circuit 12a supplies a negative voltage (−0.3 V) to the load circuit B and maintains the voltage level at −0.5 V when the word line is not selected.

The internal voltage generating circuit 12a has a current supply capability of absorbing a defective current generated between adjacent word lines or between the bit lines intersecting each other. The current supply capability of the internal voltage generating circuit 12a is half that of the internal voltage generating circuit 11. When the current supply capability of the internal voltage generating circuit 11 is 10, the current supply capability of the internal voltage generating circuit 12a is 5. In the description of the invention, the current supply capability means the amount of current supplied from the voltage generating circuit in order to charge the load circuit A to a predetermined voltage and is equal to the amount of change to be supplied per unit time. When the current supply capability is large, the time required to charge the load circuit A to a predetermined voltage is short.

The switching circuit SW includes an input terminal T1 to which the negative voltage VBB is input, an input terminal T3 to which the negative voltage VKK is input, an output terminal T2 from which the negative voltage VBB or the negative voltage VKK is output, and an output terminal T4 from which the negative voltage VBB or the negative voltage VKK is output. The switching circuit SW connects the input terminals and the output terminals on the basis of a gate signal GATE output from the switch control circuit 323 and supplies an input negative voltage from the output terminals to the load circuits.

The switch control circuit 323 receives a switching control signal 314a output from the control logic circuit 307, which will be described below. The switch control circuit 323 outputs the gate signal GATE to the switching circuit SW according to the logic level of the switching control signal 314a.

The switch control circuit 323 includes a non-volatile memory circuit 324. The non-volatile memory circuit 324 maintains the stored data even after the supply of a power voltage to the product is cut.

The non-volatile memory circuit 324 is, for example, a known fuse or antifuse. Data to be stored in the non-volatile memory circuit 324 is determined by the result of the test in the test operation mode during the product test. After the data to be stored is programmed to the non-volatile memory circuit 324, the switch control circuit 323 supplies the gate signal GATE to the switching circuit SW on the basis of the data stored in the non-volatile memory circuit 324 whenever power is supplied to the product. In some cases, the determination on the data to be stored in the non-volatile memory circuit 324 can be made by the BIST circuit. In other cases, the determination on the data to be stored in the non-volatile memory circuit 324 can be made by a tester outside the semiconductor device. If the tester determines the data to be stored in the non-volatile memory circuit 324, the data is given to the semiconductor device through terminal terminals.

The operation of each of the above-mentioned circuits will be described in brief.

In the following description of this embodiment, the test operation mode means an operation mode in which, during the product test, during the selection test after P/W or packaging in a wafer state, operations, such as read, write, and refresh operations, are performed on the semiconductor device 300 while changing a combination of the connection between two input terminals and two output terminals of the switching circuit SW. The normal operation mode means an operation mode in which operations, such as read, write, and refresh operations, are performed on the basis of the test result of the product, with the connection between the input terminals and the output terminals being fixed. Thus, the normal operation mode is a mode in which the semiconductor device has an access to an external device to perform data communication thereto.

The control signal generating circuit 305 generates an internal clock signal 311 on the basis of an external clock signal CLK that is input from a CLK input terminal CLKP. A command signal CMD and an external address signal ADD are input from a command input terminal CMDP and an external address input terminal ADDP to the command input latch/decoding circuit 306 and the address input latch/decoding circuit 308, respectively.

Examples of the command signal CMD include a READ command to perform a read operation on the DRAM, a WRITE command to perform a write operation, and a REF command to perform a refresh operation.

In addition, the command signal CMD includes a TEST command. When the TEST command is input to the command input terminal CMDP, the semiconductor device 300 sequentially changes the connection states between the input/output terminals of the switching circuit SW and proceeds to the test operation mode in which it can perform, for example, the read and write operations in each connection state.

In the test operation mode, the semiconductor device 300 can perform, for example, the read and write operations, with the supply destinations of the negative voltage VBB and the negative voltage VKK being changed. When the operation mode is changed to the test operation mode, information (inter-terminal connection information) indicating the input and output terminals to be connected in the switching circuit SW is also input from the command input terminal CMDP, the address input terminal ADDP, the data input/output terminal DQP, or an input terminal (not shown in FIG. 3).

The command signal CMD is decoded by the command input latch/decoding circuit 306 and is then input to the control logic circuit 307.

The control logic circuit 307 generates an X address-based control signal 312, a Y address-based control signal 314, and the switching control signal 314a in both the test operation mode and the normal operation mode in response to the input command.

The address input latch/decoding circuit 308 receives the X address-based control signal 312 and supplies an X address signal 313 and a Y address signal 315 to the X decoder/word driver circuit 302 and the Y decoder/Y switching circuit 303, respectively.

The control logic circuit 307 outputs the X address-based control signal 312 and the Y address-based control signal 314 and controls the X decoder/word driver circuit 302 and the Y decoder/Y switching circuit 303 to perform desired operations, such as write and read operations, on the memory cells in the memory cell array.

The data write or read operation is performed on the memory cells according to the logic level of the data input/suppliesignal DQ that is input to or output from the data input/output terminal DQP through the data input/output circuit 309, a data bus 316, and the sense amplifier/IO circuit 304.

The switching control signal 314a output from the control logic circuit 307 is, for example, a plurality of signals and includes information indicating whether the semiconductor device 300 is in the test operation mode and information indicating the connection between the terminals of the switching circuit SW. The control logic circuit 307 supplies the switching control signal 314a to the switch control circuit 323 in both the test operation mode and the normal operation mode.

The operation of the semiconductor device 300 has been described in brief above. Next, the test operation mode and the normal operation mode of the internal voltage supply unit 320, which is a characteristic unit of this embodiment, will be described.

In the test operation mode, the switch control circuit 323 determines whether the semiconductor device 300 is in the test operation mode on the basis of a plurality of input switching control signals 314a. If it is determined that the semiconductor device 300 is in the test operation mode, the switch control circuit 323 supplies the gate signal GATE determining the inter-terminal connection information to the switching circuit SW. In the normal operation mode, the switch control circuit 323 reads the inter-terminal connection information determined during the product test from the non-volatile memory circuit 324 and supplies the gate signal GATE corresponding to the logic level of the read information to the switching circuit SW.

Figures 4A, 4B:
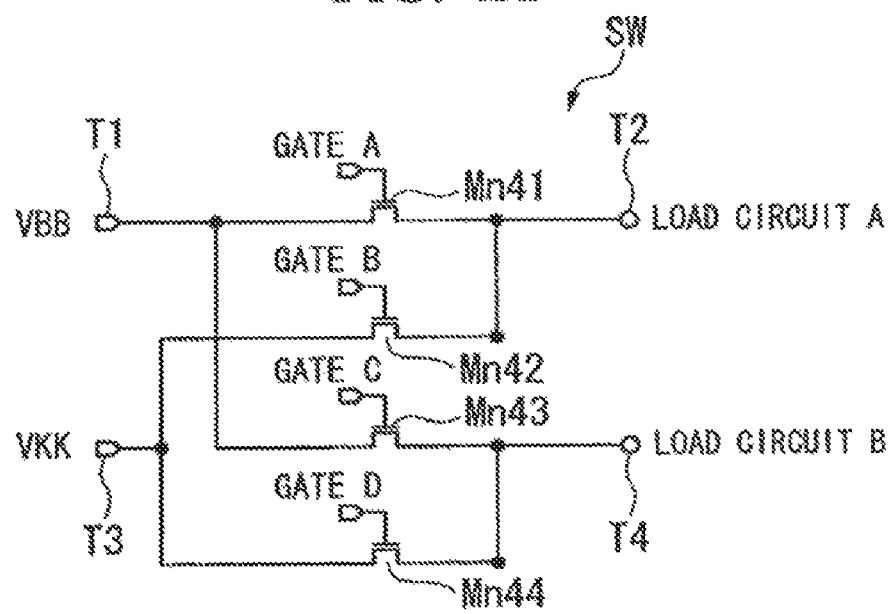
FIG. 4A is a circuit diagram illustrating the detailed structure of the switching circuit SW shown in FIG. 3 using transistors.
FIG. 4B is a diagram illustrating the turning-on/off of the transistors by the gate signal GATE and the connection relationship between the input and output terminals.

FIGS. 4A to 4B are diagrams illustrating the detailed switching control operation of the internal voltage supply unit 320. FIG. 4A is a circuit diagram illustrating the detailed structure of the switching circuit SW shown in FIG. 3 using transistors. FIG. 4B is a diagram illustrating the turning-on/off of the transistors by the gate signal GATE and the connection relationship between the input and output terminals.

The two internal voltage generating circuits are the internal voltage generating circuit 11 and the internal voltage generating circuit 12a shown in FIG. 3.

As shown in FIG. 4A, the switching circuit SW is a so-called transfer gate type and includes N-channel MOS transistors Mn41 to Mn44, the input terminal T1, the output terminal T2, the input terminal T3, and the output terminal T4.

In the N-channel MOS transistor Mn41, one of the source terminal and the drain terminal is connected to the input terminal T1, and the other terminal of the source terminal and the drain terminal is connected to the output terminal T2. In addition, a gate signal GATEA is input to the gate terminal of the N-channel MOS transistor Mn41.

In the N-channel MOS transistor Mn42, one of the source terminal and the drain terminal is connected to the input terminal T3, and the other terminal of the source terminal and the drain terminal is connected to the output terminal T2. In addition, a gate signal GATEB is input to the gate terminal of the N-channel MOS transistor Mn42.

In the N-channel MOS transistor Mn43, one of the source terminal and the drain terminal is connected to the input terminal T1, and the other terminal of the source terminal and the drain terminal is connected to the output terminal T4. In addition, a gate signal GATEC is input to the gate terminal of the N-channel MOS transistor Mn43.

In the N-channel MOS transistor Mn44, one of the source terminal and the drain terminal is connected to the input terminal T3, and the other terminal of the source terminal and the drain terminal is connected to the output terminal T4. In addition, a gate signal GATED is input to the gate terminal of the N-channel MOS transistor Mn44. However, the transfer gate may include a complementary transistor, such as a CMOS. Each control signal input to each transfer gate may be a logic combination of a plurality of control signals from the memory circuit 324.

In this way, in the test operation mode, it is possible to connect the terminals as shown in FIG. 4B. FIG. 4B shows the on/off states of the N-channel MOS transistors Mn41 to Mn44 to which the gate signals GATEA to GATED are input and the supply of the negative voltage VBB and the negative voltage VKK to the load circuit A and the load circuit B.

When the gate signals GATEA and GATED input to the switching circuit SW are at an H level and the gate signals GATEC and GATED are at an L level, the N-channel MOS transistors Mn41 and Mn44 are turned on and the N-channel MOS transistors Mn42 and Mn43 are turned off. In this way, the input terminal T1 and the output terminal T2 are connected to each other, and the input terminal T3 and the output terminal T4 are connected to each other. As shown in (1) of FIG. 4C, the negative voltage VBB is supplied to the load circuit A and the negative voltage VKK is supplied to the load circuit B.

When the gate signals GATEA and GATEC input to the switching circuit SW are at an H level and the gate signals GATEB and GATED are at an L level, the N-channel MOS transistors Mn41 and Mn43 are turned on and the N-channel MOS transistors Mn42 and Mn44 are turned off. In this way, the input terminal T1 and the output terminal T2 are connected to each other and the input terminal T1 and the output terminal T4 are connected to each other. As shown in (2) of FIG. 4B, the negative voltage VBB is supplied to both the load circuit A and the load circuit B.

When the gate signals GATEB and GATED input to the switching circuit SW are at an H level and the gate signals GATEA and GATEC are at an L level, the N-channel MOS transistors Mn42 and Mn44 are turned on and the N-channel MOS transistors Mn41 and Mn43 are turned off. In this way, the input terminal T3 and the output terminal T2 are connected to each other and the input terminal T3 and the output terminal T4 are connected to each other. As shown in (3) of FIG. 4B, the negative voltage VKK is supplied to both the load circuit A and the load circuit B.

When the gate signals GATEB and GATEC input to the switching circuit SW are at an H level and the gate signals GATEA and GATED are at an L level, the N-channel MOS transistors Mn42 and Mn43 are turned on and the N-channel MOS transistors Mn41 and Mn44 are turned off. In this way, the input terminal T3 and the output terminal T2 are connected to each other and the input terminal T1 and the output terminal T4 are connected to each other. As shown in (4) of FIG. 4B, the negative voltage VKK is supplied to the load circuit A and the negative voltage VBB is supplied to the load circuit B.

As such, the switching circuit SW can perform $2^2$ (=4) switching operations by a combination (inter-terminal connection information) of the logic levels of the gate signals GATEA to GATED. In this way, in the test operation mode, one of the negative voltage VBB and the negative voltage VKK is supplied to the load circuit A or the load circuit B. One of the gate signal GATEA and the gate signal GATEB may be a logically inverted signal of the other signal. Similarly, one of the gate signal GATEC and the gate signal GATED may be a logically inverted signal of the other signal.

When the internal voltage supply unit 320 has the above-mentioned structure, the semiconductor device 300 can select any one of $2^2$ (=4) combinations of the connection between the input and output terminals of the switching circuit SW and perform, for example, the read and write operations in each of the selected states in the test operation mode during the product test. After the product test, the optimal combination (inter-terminal connection information) of the connection between the input and output terminals determined from the four combinations, that is, the optimal combination of the logic levels of the gate signals GATEA to GATED is stored in the non-volatile memory circuit 324. During each operation that is performed after power is supplied to the product, that is, in the normal operation mode, the semiconductor device 300 can fix the connection between the input and output terminals of the switching circuit SW on the basis of the inter-terminal connection information stored in the non-volatile memory circuit 324 and perform, for example, the read and write operations.

Next, switching control after the semiconductor device according to this embodiment is manufactured will be described while describing the characteristics of the load circuits in detail.

Figures 5A, 5B:
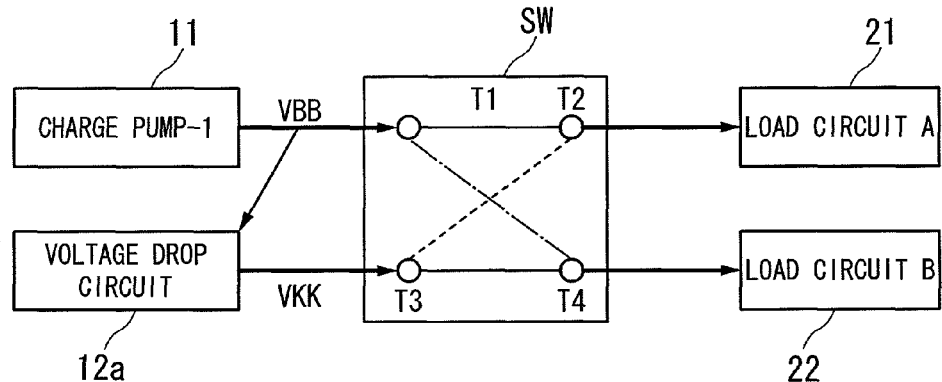
FIG. 5A is a diagram illustrating the correspondence between the voltage generating circuits and the load circuit A in the switching control.
FIG. 5B is a diagram illustrating the correspondence between the voltage generating circuits and the load circuit A in the switching control.

FIGS. 5A and 5B are diagrams illustrating the correspondence between the voltage generating circuits and the load circuit A in the switching control. FIG. 5A shows the internal voltage generating circuit 11 (charge pump 1) shown in FIG. 3, the internal voltage generating circuit 12a (step-down circuit), a load circuit (referred to as a load circuit A) that is connected to the output terminal T2, a load circuit (referred to as a load circuit B) that is connected to the output terminal T4, and the switching circuit SW. As described above, in the switching circuit SW, the input terminal T1 and the output terminal T2, the input terminal T1 and the output terminal T4, the input terminal T3 and the output terminal T2, or the input terminal T3 and the output terminal T4 are connected to each other by the gate signals GATEA to GATED output from the switch control circuit 323.

The internal voltage (negative voltage VBB) or the internal voltage (negative voltage VKK) is supplied from one of the internal voltage generating circuit 11 and the internal voltage generating circuit 12a to the load circuit A by the switching circuit SW. In addition, the internal voltage (negative voltage VBB) or the internal voltage (negative voltage VKK) is supplied from one of the internal voltage generating circuit 11 and the internal voltage generating circuit 12a to the load circuit B by the switching circuit SW.

FIG. 5B is a diagram illustrating the switching relationship between the voltages generated by the internal voltage generating circuit 11 and the internal voltage generating circuit 12a and the voltages supplied to the load circuit A and the load circuit B.

In FIG. 5B, the internal voltage generating circuit 11 (charge pump 1) generates a substrate voltage of −0.5 V, and the internal voltage generating circuit 12a (step-down circuit) generates −0.3 V from a substrate voltage of −0.5 V. In FIG. 5B, 'default' indicates that the input terminal T1 and the output terminal T2 are connected to each other and the input terminal T3 and the output terminal T4 are connected to each other in the switching circuit SW. That is, in the test operation mode, first, the semiconductor device 300 shown in FIG. 3 is operated by the default voltage.

Specifically, the switch control circuit 323 determines whether the semiconductor device 300 is in the test operation mode on the basis of a plurality of input switching control signals 314a, and supplies the gate signal GATE for determining the inter-terminal connection information to the switching circuit SW.

The gate signals GATEA and GATED input to the switching circuit are at an H level and the gate signals GATEB and GATEC are at an L level. The N-channel MOS transistor Mn41 and the N-channel MOS transistor Mn44 are turned on, and the N-channel MOS transistor Mn42 and the N-channel MOS transistor Mn43 are turned off, referred to FIGS. 4B and 4C.

The P well layer (load circuit A) in which the N-channel MOS transistors of all of the circuits shown in FIG. 3 are formed is connected to the internal voltage generating circuit 11 through the switching circuit SW and is supplied with the negative voltage VBB (−0.5 V). In addition, the source terminal (load circuit B) of each N-channel MOS transistor (which is not shown in FIG. 3, but corresponds to the N-channel MOS transistor Mn21 in FIG. 2) of a plurality of word drivers provided in the X decoder/word driver circuit 302 is connected to the internal voltage generating circuit 12a through the switching circuit SW and is supplied with the negative voltage VKK (−0.3 V).

In this bias state, in the holding test of the semiconductor device 300, for example, in the write disturb hold test (which repeatedly performs a write operation to increase the period for which the bit line is at an L level, increases the sub-threshold current of a selecting transistor of a non-selected memory cell connected to the bit line, and determines whether the holding time satisfies the product standard), the holding time does not satisfy the standard. In this case, in the product test using the test operation mode, the semiconductor device 300 is determined to be defective.

However, when the absolute value of the negative voltage supplied to the load circuit B increases, that is, when the negative voltage is −0.5 V, the sub-threshold current of the selecting transistor of the non-selected memory cell is generally reduced. Therefore, when the holding test is performed after the negative voltage supplied to the load circuit B is changed to −0.5 V, in some cases, the test result is good.

The connection relationship represented by case 1 in FIG. 5B is established between the terminals of the switching circuit SW in the test operation mode, and the hold test is performed in this bias state. Specifically, a TEST command is input to the command signal CMD, and information on the connection between the terminals of the switching circuit SW is also input. The switch control circuit 323 determines whether the semiconductor device 300 is in the test operation mode on the basis of a plurality of input switching controls signal 314a, and supplies the gate signal GATE for determining the inter-terminal connection information to the switching circuit SW.

In the gate signal GATE input to the switching circuit SW, the gate signals GATEA and GATEC are at an H level, and the gate signals GATEB and GATED are at an L level. The N-channel MOS transistor Mn41 and the N-channel MOS transistor Mn43 are turned on, and the N-channel MOS transistor Mn42 and the N-channel MOS transistor Mn44 are turned off (see FIGS. 4B and 4C).

Therefore, the load circuit A is connected to the internal voltage generating circuit 11 through the switching circuit SW and is supplied with the negative voltage VBB (−0.5 V). The load circuit B is also connected to the internal voltage generating circuit 11 through the switching circuit SW and is supplied with the negative voltage VBB (−0.5 V).

In this bias state, when the hold test is performed and the test result is good, the connection state (inter-terminal connection information) of the case 1 is stored in the non-volatile memory circuit 324 shown in FIG. 3. In this way, after power is supplied to the product, the switch control circuit 323 controls the gate signal GATE output to the switching circuit SW such that the gate signals GATEA and GATEC are at an H level and the gate signals GATEB and GATED are at an L level.

Therefore, both the load circuit A and the load circuit B of the semiconductor device 300 are connected to the internal voltage generating circuit 11 through the switching circuit SW and are supplied with the negative voltage VBB (−0.5 V). The semiconductor device 300 performs, for example, the write and read operations (normal operation mode) in this bias state. The semiconductor device is defective at the default value, but becomes a non-defective product by determining the bias on the basis of the result of the hold test.

It is assumed that, in the default bias state, in the speed test of the semiconductor device 300, for example, in the speed test, such as tRAC or tAA (the test which checks whether the time from the input of a signal to a reference input terminal to the output of data stored in the memory cell to the DQ terminal satisfies the product standard), the semiconductor device 300 does not satisfy the speed test standard. In this case, as a result of the product test in the test operation mode, the semiconductor device 300 is determined to be defective.

When the absolute value of the negative voltage supplied to the load circuit A is reduced, that is, when the negative voltage is −0.3 V, the threshold voltage (Vt) of the N-channel MOS transistor in the load circuit A is small. When the speed test is performed after the negative voltage supplied to the load circuit A is changed to −0.3 V, the test result may be determined to be good in some cases.

The connection relationship represented by case 2 in FIG. 5B is established between the terminals of the switching circuit SW in the test operation mode of the product test, and the speed test is performed in this bias state. Specifically, the TEST command is input to the command signal CMD, and information on the connection between the terminals of the switching circuit SW is also input. The switch control circuit 323 determines whether the semiconductor device 300 is in the test operation mode on the basis of a plurality of input switching controls signal 314*a*, and supplies the gate signal GATE for determining the inter-terminal connection information to the switching circuit SW.

In the gate signal GATE input to the switching circuit, the gate signals GATEB and GATED are at an H level, and the gate signals GATEA and GATEC are at an L level. The N-channel MOS transistor Mn42 and the N-channel MOS transistor Mn44 are turned on, and the N-channel MOS transistor Mn41 and the N-channel MOS transistor Mn43 are turned off (see FIGS. 4B and 4C).

Therefore, the load circuit A is connected to the internal voltage generating circuit 12*a* through the switching circuit SW and is supplied with the negative voltage VKK (−0.3 V). The load circuit B is also connected to the internal voltage generating circuit 12*a* through the switching circuit SW and is supplied with the negative voltage VKK (−0.3 V).

In this bias state, when the speed test is performed and the test result is good, the connection state (inter-terminal connection information) of the case 2 is stored in the non-volatile memory circuit 324 shown in FIG. 3.

After power is supplied to the product, the switch control circuit 323 controls the gate signal GATE output to the switching circuit SW such that the gate signals GATEB and GATED are at an H level and the gate signals GATEA and GATEC are at an L level.

Therefore, both the load circuit A and the load circuit B of the semiconductor device 300 are connected to the internal voltage generating circuit 12*a* through the switching circuit SW and are supplied with the negative voltage VKK (−0.3 V). The semiconductor device 300 performs, for example, the write and read operations (normal operation mode) in this bias state. The semiconductor device is defective at the default value, but becomes a non-defective product by determining the bias on the basis of the result of the speed test.

It is assumed that, in the default bias state, the semiconductor device 300 does not satisfy either the speed test standard or the hold test standard. In this case, as a result of the product test in the test operation mode, the semiconductor device 300 is determined to be defective.

However, when the two tests are performed after the absolute value of the negative voltage supplied to the load circuit A is reduced and the absolute value of the negative voltage supplied to the load circuit B is increased, the test result is determined to be good in some cases. After the voltage supplied to the load circuit A is changed to −0.3 V and the voltage supplied to the load circuit B is changed to −0.5 V, the test result is determined to be good in some cases.

The connection relationship represented by case 3 in FIG. 5B is established between the terminals of the switching circuit SW in the test operation mode of the product test, and the voltage is supplied to the load circuit A and the load circuit B in the bias state shown in FIG. 5B. Then, the hold test and the speed test are performed in this bias state. Specifically, as described above, the TEST command is input to the command signal CMD, and information on the connection between the terminals of the switching circuit SW is also input. The switch control circuit 323 determines whether the semiconductor device 300 is in the test operation mode on the basis of a plurality of input switching controls signal 314*a*. The switch control circuit 323 supplies the gate signal GATE for determining the inter-terminal connection information to the switching circuit SW.

In the gate signal GATE input to the switching circuit, the gate signals GATEB and GATEC are at an H level, and the gate signals GATEA and GATED are at an L level. The N-channel MOS transistor Mn42 and the N-channel MOS transistor Mn43 are turned on, and the N-channel MOS transistor Mn41 and the N-channel MOS transistor Mn44 are turned off, referred to FIGS. 4A and 4B.

Therefore, the load circuit A is connected to the internal voltage generating circuit 12*a* through the switching circuit SW and is supplied with the negative voltage VKK (−0.3 V). The load circuit B is connected to the internal voltage generating circuit 11 through the switching circuit SW and is supplied with the negative voltage VBB (−0.5 V).

In this bias state, when the two tests are performed and the test result is good, the connection state (inter-terminal connection information) of the case 3 is stored in the non-volatile memory circuit 324 shown in FIG. 3.

After power is turned on in the subsequent product operation, the switch control circuit 323 controls the gate signal GATE output to the switching circuit SW such that the gate signals GATEB and GATEC are at an H level and the gate signals GATEA and GATED are at an L level.

Therefore, the load circuit A of the semiconductor device 300 is supplied with the negative voltage VKK (−0.3 V) and the load circuit B is supplied with the negative voltage VBB (−0.5 V). The semiconductor device 300 performs, for example, the write and read operations (normal operation mode) in this bias state. The semiconductor device is defective at the default value, but becomes a non-defective product by determining the bias on the basis of the results of the two tests.

As such, the semiconductor device (semiconductor device 300) according to this embodiment includes m (m=2) internal voltage generating circuits (the internal voltage generating circuit 11 and the internal voltage generating circuit 12*a*) and n (n=2) load circuits (the load circuit A and the load circuit B) that are supplied with a voltage (the negative voltage VBB or the negative voltage VKK) from at least one of the m (m=2) internal voltage generating circuits through the switching circuit (switching circuit SW). The switching circuit (switching circuit SW) connects the n (n=2) load circuits (the load circuit A and the load circuit B) and the m internal voltage generating circuits (the internal voltage generating circuit 11 and the internal voltage generating circuit 12*a*) by one of $m^n$ (=4) combinations of connections on the basis of the control signals (gate signals GATEA to GATED) that are not changed after being set.

According to the above-described embodiment of the invention, it is possible to perform switching control to test the characteristics of the load circuits in each of the manufactured semiconductor devices. In this way, it is possible to allocate the internal voltage generating circuit most suitable for the characteristics of the load circuit A. As a result, it is possible to improve product yield and reduce manufacturing costs.

In the above-mentioned test method, switching control is performed to test the characteristics of the load circuit A. However, switching control may be performed to test the characteristics of the internal voltage generating circuit. This can be easily implemented by those skilled in the art.

It is possible to settle the switching control using a test method only for the load circuit A or the internal voltage generating circuit, instead of the test method using switching control. In particular, the test method and the settlement of the switching control value to which the test result is reflected are useful for all kinds of semiconductor products in which the inside of the semiconductor chip can be divided into predetermined functional blocks, such as a CPU (Central Processing Unit), an MCU (micro Control Unit), a DSP (Digital Signal Processor), an ASIC (Application Specific Integrated Circuit), and an ASSP (Application Specific Standard Circuit).

In the above-mentioned test method, switching control is performed to test the characteristics of the load circuit A. However, switching control may be performed to test the characteristics of the internal voltage generating circuit. This can be easily implemented by those skilled in the art.

Second Embodiment

Another embodiment of the invention will be described.

Figures 6A, 6B:
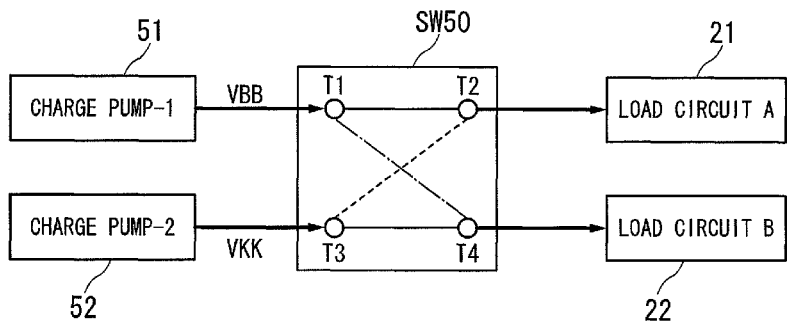
FIG. 6A is a diagrams illustrating the correspondence between voltage generating circuits and load circuits of the semiconductor device in switching control.
FIG. 6B is a diagrams illustrating the correspondence between voltage generating circuits and load circuits of the semiconductor device in switching control.

FIGS. 6A and 6B are diagrams illustrating the correspondence between voltage generating circuits and load circuits of the semiconductor device 300 in switching control. FIG. 6A shows an internal voltage generating circuit 51 (charge pump 1), an internal voltage generating circuit 52 (charge pump 2), a load circuit (load circuit A), a load circuit (load circuit B), and a switching circuit SW50. The internal voltage generating circuit 51 corresponds to the internal voltage generating circuit 11 shown in FIGS. 5A to 5C, and the internal voltage generating circuit 52 corresponds to the internal voltage generating circuit 12a shown in FIGS. 5A to 5C. However, the internal voltage generating circuits 51 and 52 are different from the internal voltage generating circuits 11 and 12a in a supply voltage and current capability, which will be described below. Similar to the first embodiment, the load circuit A is a P-type substrate in which all N-channel MOS transistors are formed, and the load circuit B is the source terminal of the N-channel MOS transistor of the word driver.

The switching circuit SW50 has the same structure as the switching circuit SW shown in FIG. 4B. In the switching circuit SW50, the input terminal T1 and the output terminal T2, or the input terminal T1 and the output terminal T4 are connected to each other, and the input terminal T3 and the output terminal T2, or the input terminal T3 and the output terminal T4 are connected to each other by the gate signals GATEA to GATED output from the switch control circuit 323.

An internal voltage (negative voltage VBB) or an internal voltage (negative voltage VKK) is supplied from one of the internal voltage generating circuit 51 and the internal voltage generating circuit 52 to the load circuit A by the switching circuit SW50. In addition, the internal voltage (negative voltage VBB) or the internal voltage (negative voltage VKK) is supplied from one of the internal voltage generating circuit 51 and the internal voltage generating circuit 52 to the load circuit B by the switching circuit SW.

FIG. 6B is a diagram illustrating the switching relationship between the voltages generated by the internal voltage generating circuits 51 and 52, current supply capabilities thereof, and supply capability to the load circuit A and the load circuit B.

As shown in FIG. 6B, the internal voltage generating circuit 51 (charge pump 1) generates a substrate voltage of −0.5 V. The internal voltage generating circuit 52 (charge pump 2) generates a substrate voltage of −0.5 V. The current supply capability of the internal voltage generating circuit 52 is half that of the internal voltage generating circuit 51. When the current supply capability of the internal voltage generating circuit 51 is 10, the current supply capability of the internal voltage generating circuit 52 is 5.

In FIG. 6B, 'default' indicates that the input terminal T1 and the output terminal T2 are connected to each other and the input terminal T3 and the output terminal T4 are connected to each other in the switching circuit SW50. In the test operation mode, first, the semiconductor device 300 shown in FIG. 3 is operated by the default voltage.

Specifically, the switch control circuit 323 determines whether the semiconductor device 300 is in the test operation mode on the basis of a plurality of input switching control signals 314a. The switch control circuit 323 supplies the gate signal GATE for determining the inter-terminal connection information to the switching circuit SW.

The gate signals GATEA and GATED input to the switching circuit are at an H level and the gate signals GATEB and GATEC are at an L level. The N-channel MOS transistor Mn41 and the N-channel MOS transistor Mn44 are turned on, and the N-channel MOS transistor Mn42 and the N-channel MOS transistor Mn43 are turned off, referred to FIGS. 4B and 4C.

Therefore, the P well layer (load circuit A) in which the N-channel MOS transistors of all of the circuits shown in FIG. 3 are formed is connected to the internal voltage generating circuit 51 through the switching circuit SW and is supplied with the negative voltage VBB (−0.5 V). In addition, the source terminal (load circuit B) of each N-channel MOS transistor (which is not shown in FIG. 3, but corresponds to the N-channel MOS transistor Mn21 in FIG. 2) of a plurality of word drivers provided in the X decoder/word driver circuit 302 is connected to the internal voltage generating circuit 52 through the switching circuit SW and is supplied with the negative voltage VKK (−0.5 V).

In the default bias state, the semiconductor device 300 is performed in the test operation mode during the product test. However, when there is a large amount of leakage current in the load circuit B, for example, when there is a defect between a non-selected word line and a word line adjacent to the non-selected word line or between the non-selected word line and a bit line intersecting the non-selected word line, it is difficult for the internal voltage generating circuit 52 with low current supply capability to maintain the voltage of the non-selected word line at a predetermined value (in this case, −0.5 V). In this case, it is difficult to perform the test in the test operation mode of the product, for example, the hold test. In addition, in the standby current test, a large amount of current flows to the internal voltage generating circuit 52 and the product does not satisfy the current standard. As a result, in some cases, the product is determined to be defective.

However, when the load circuit B is supplied with the same voltage and is connected to the internal voltage generating circuit 51 with high current supply capability, it is possible to maintain the voltage of the non-selected word line at a predetermined value and perform, for example, the above-mentioned hold test. Since the internal voltage generating circuit 51 with high current supply capability accounts for a large percentage of the standby current, it can sufficiently absorb the defective current of the load circuit B, which prevents in an increase in the standby current. Therefore, in some cases, the internal voltage generating circuit satisfies the current standard.

When the leakage current of the load circuit A to the substrate is small, the internal voltage generating circuit 52 can absorb the substrate current.

Therefore, when the load circuit A is connected to the internal voltage generating circuit 52, the internal voltage generating circuit 51 can absorb the defective current of the load circuit B, which prevents an increase in the standby current.

In the test operation mode, when the hold test or the current test is performed while switching the connected voltage generating circuit, with the voltage supplied to both the load circuit A and the load circuit B being maintained at −0.5 V, the semiconductor device may be determined to be good.

The connection relationship represented by case 4 in FIG. 6B is established between the terminals of the switching circuit SW in the test operation mode, and the hold test is performed in this bias state. Specifically, similar to the first embodiment, the TEST command is input to the command signal CMD, and information on the connection between the terminals of the switching circuit SW is also input. The switch control circuit 323 determines whether the semiconductor device 300 is in the test operation mode on the basis of a plurality of input switching control signals 314a, and supplies the gate signal GATE for determining the inter-terminal connection information to the switching circuit SW.

In the gate signal GATE input to the switching circuit, the gate signals GATEB and GATEC are at an H level, and the gate signals GATEA and GATED are at an L level. The N-channel MOS transistor Mn42 and the N-channel MOS transistor Mn43 are turned on, and the N-channel MOS transistor Mn41 and the N-channel MOS transistor Mn44 are turned off, referred to FIGS. 4B and 4C.

Therefore, the load circuit A is connected to the internal voltage generating circuit 52 through the switching circuit SW and is supplied with the negative voltage VKK (−0.5 V). The load circuit B is connected to the internal voltage generating circuit 51 through the switching circuit SW and is supplied with the negative voltage VBB (−0.5 V).

In this bias state, when the hold test is performed and the test result is good, the connection state (inter-terminal connection information) of the case 4 is stored in the non-volatile memory circuit 324 shown in FIG. 3. After power is supplied to the product, the switch control circuit 323 controls the gate signal GATE output to the switching circuit SW such that the gate signals GATEB and GATEC are at an H level and the gate signals GATEA and GATED are at an L level.

Therefore, the load circuit A of the semiconductor device 300 is supplied with the negative voltage VKK (−0.5 V) from the internal voltage generating circuit 52 with low current supply capability. The load circuit B is supplied with the negative voltage VBB (−0.5 V) from the internal voltage generating circuit 51 with high current supply capability. The semiconductor device 300 performs, for example, the write and read operations (normal operation mode) in this bias state. The semiconductor device is defective at the default value, but becomes a non-defective product by determining the bias on the basis of the results of the two tests.

In this embodiment, the connection between the input terminal T1 and the output terminal T2 and the connection between the input terminal T1 and the output terminal T4 are switched, and the connection between the input terminal T3 and the output terminal T2 and the connection between the input terminal T3 and the output terminal T4 are switched, corresponding to the switching of the case 1 and the case 2 in the first embodiment. The reason is that, when the load circuit A and the load circuit B are connected to a common voltage generating circuit, there is no influence due to the leakage current from the load circuits, for example, there is no increase in the standby current.

As such, the semiconductor device (semiconductor device 300) according to this embodiment includes m (m=2) internal voltage generating circuits (the internal voltage generating circuit 51 and the internal voltage generating circuit 52) and n (n=2) load circuits (the load circuit A and the load circuit B) that are supplied with a voltage (the negative voltage VBB or the negative voltage VKK) from at least one of the m (m=2) internal voltage generating circuits through the switching circuit (switching circuit SW50). The switching circuit (switching circuit SW50) connects the n (n=2) load circuits (the load circuit A and the load circuit B) and the m internal voltage generating circuits (the internal voltage generating circuit 51 and the internal voltage generating circuit 52) by one of m″ (=4) combinations of connections on the basis of the control signals (gate signals GATEA to GATED) that are not changed after being set.

The semiconductor device (semiconductor device 300) includes a non-volatile memory unit (non-volatile memory circuit 324) that stores one combination of the connection between the internal voltage generating circuits and the load circuits determined in the examination test (in the test operation mode during the product test) that evaluates the characteristics of the load circuits (the load circuit A and the load circuit B), and the switching circuit (switching circuit SW50) is controlled by the one stored combination of the connection.

In the examination test (in the test operation mode during the product test), the switching circuit (switching circuit SW50) connects the n (n=2) load circuits (the load circuit A and the load circuit B) and the m (m=2) internal voltage generating circuits (the internal voltage generating circuit 51 and the internal voltage generating circuit 52) and the test is performed, thereby forming the one combination of the connection.

At least two internal voltage generating circuits (the internal voltage generating circuit 51 and the internal voltage generating circuit 52) among the m (m=2) internal voltage generating circuits have different current supply capabilities (in this case, when the current supply capability of the internal voltage generating circuit 51 is 10, the current supply capability of the internal voltage generating circuit 52 is 5) and supplies the same voltage (in this case, −0.5 V).

According to this embodiment, it is possible to connect a plurality of load circuits to the internal voltage generating circuit with current supply capability suitable for the characteristics of the load circuits, according to the characteristics of the load circuits. In this way, it is possible to maintain the voltage of the load circuit A at a predetermined value and improve the quality of a product.

In the above-described embodiment of the invention, m and n are 2, that is, two load circuits are provided for two internal voltage generating circuits. However, as shown in FIG. 7, m and n may be 3.

Figure 7:
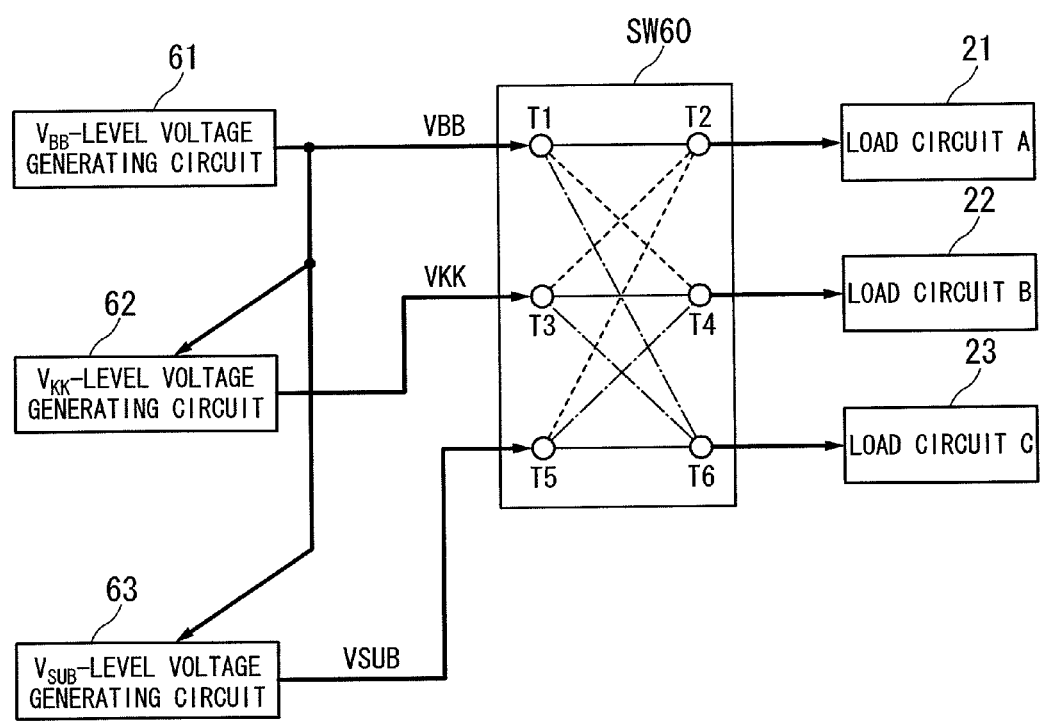
FIG. 7 is a diagram showing three internal voltage generating circuits.

FIG. 7 shows three internal voltage generating circuits, that is, an internal voltage generating circuit 61 (VBB level generating circuit), an internal voltage generating circuit 62 (VKK level generating circuit), and an internal voltage generating circuit 63 (VSUB level generating circuit), and three load circuits, that is, a load circuit A, a load circuit B, and a load circuit C. In addition, a switching circuit SW60 is provided between the three internal voltage generating circuits and the three load circuits.

The switching circuit SW60 includes three input terminals (an input terminal T1, an input terminal T3, and an input terminal T5) and three output terminals (an output terminal T2, an output terminal T4, and an output terminal T6).

Similar to the above-described embodiment, the switching circuit SW60 can perform $3^3$ (=27) switching operations between the input and output terminals in the test operation mode. In the normal operation, the internal voltage generating circuits and the load circuits are connected to each other by only one connection relationship among 27 connection relationships.

The load circuit C is, for example, a P-type well layer that supplies a negative back-bias voltage (substrate voltage) to the selecting transistor MS of the memory cell MC. The load circuit A is a P-type well layer that supplies a negative back-bias voltage to all of the N-channel MOS transistors of the semiconductor device except for the selecting transistor MS. The load circuit B is the source terminal of the N-channel MOS transistor of the word driver, similar to the above-described embodiment.

According to this structure, when the hold test is performed in the test operation mode, it is possible to change the threshold voltage (Vt) of the selecting transistor. For example, the following is the default: the internal voltage generating circuit 61 (VBB level generating circuit) supplies a negative voltage of −0.5 V to the load circuit A; the internal voltage generating circuit 62 (VKK level generating circuit) supplies a negative voltage of −0.3 V to the load circuit B; and the internal voltage generating circuit 63 (VSUB level generating circuit) supplies a negative voltage of −0.4 V to the load circuit C.

When the hold test standard is not satisfied with the default negative voltage VSUB (−0.4 V) supplied to the load circuit C and the connection destination of the load circuit C is changed to a negative voltage of −0.3 V, the threshold voltage of the selecting transistor MS is reduced. In this case, an H-level write voltage to the memory cell capacitor CS increases or a diffusion layer leakage current from an N-type diffusion layer of the selecting transistor MS close to the memory cell capacitor CS to a P-type substrate is reduced. Therefore, in some cases, the hold test standard is satisfied.

In the test operation mode, the switching connection of the switching circuit is changed such that the negative voltage VBB (−0.3 V) is supplied to the load circuit C, and the hold test is performed. As a result, the hold time standard is not satisfied, and the connection destination of the load circuit C is determined to the internal voltage generating circuit 62 (VKK level generating circuit) that supplies the negative voltage VBB (−0.3 V).

As described in the technical spirit of the invention, the sub-threshold current of the selecting transistor of the memory cell is not necessarily reduced as the back-bias voltage is increased (the absolute value is increased), but there is a bias voltage that allows the current value to be the minimum by the GIDL characteristics of the transistor. Therefore, in the test operation mode, for example, the hold time is measured, with the load circuit B connected to each of the internal voltage generating circuit 61 and the internal voltage generating circuit 63. The connection destination with a long hold time is determined as the connection destination of the load circuit B.

The internal voltage generating circuit to which the load circuit A is connected is determined by the same method as described above in terms of speed.

In the test operation mode, after each test is performed to the connection destination of the load circuit A, the above-mentioned programming (the storage of the inter-terminal connection information in the non-volatile circuit) is performed. Then, in the subsequent product operation, for example, the read and write operations (normal operation mode) are performed with the connection between the load circuits and the internal voltage generating circuits fixed. In some casus, each of the above-described tests can be performed by the external tester outside the semiconductor device. In some cases, each of the above-described tests can be performed by the BIST. Similarly, the above-described programming can also be performed by either the external tester or the BIST.

In the above-described embodiment, m is equal to n, that is, the number of internal voltage generating circuits is equal to the number of load circuits. However, m and n are not necessarily equal to each other. For example, the switching circuit may perform switching control between 2 (m=2) internal voltage generating circuits and 3 (n=3) load circuits. In this case, combinations of the switching operations in the test operation mode are $2^3$ (=8).

In the above-described embodiment, the load circuit A supplies the negative voltage. However, the invention can be applied to the load circuits that supply a positive voltage.

For example, an N well layer in which all P-channel MOS transistors of the semiconductor device are formed is the load circuit A, and a source terminal of a power-supply-side P-channel transistor (corresponding to the P-channel MOS transistor Mp21 in FIG. 2) of the word driver is the load circuit B.

The semiconductor device includes a step-down circuit that reduces an external power voltage VDD to generate a positive voltage Vint and a circuit that generates a boosted voltage (positive voltage Vboot) on the basis of the internal voltage Vint as the internal voltage generating circuits.

The following is the default: the positive voltage Vint is supplied to the load circuit A by the switching circuit; and the positive voltage Vboot is supplied to the load circuit B by the switching circuit. In the test operation mode during the product test, for example, when the standby current of the product is measured, the current standard is not satisfied, and the positive voltage Vboot is supplied to the load circuit A, the absolute value of the threshold voltage of the P-channel MOS transistor increases. Therefore, the current standard may be satisfied.

The switching circuit changes the connection of the terminals such that the positive voltage Vboot is supplied to the load circuit A, and the current measurement test is performed. As a result, when the current standard is satisfied, the above-mentioned programming (the storage of the inter-terminal connection information in the non-volatile circuit) is performed. Then, in the subsequent product operation, for example, the connection between the terminals of the switching circuit is fixed such that the positive voltage Vboot is supplied to both the load circuit A and the load circuit B, and the read and write operations (normal operation mode) are performed in this state.

In a plurality of internal voltage generating circuits sharing one switching circuit, the circuit that supplies the positive voltage and the circuit that supplies the negative voltage are not mixed. In a plurality of load circuits sharing one switching circuit, the circuit that is supplied with the positive voltage and the circuit that is supplied with the negative voltage are not mixed. According to this structure, in some cases, the negative voltage is applied to the N well of the load circuit A through the switching circuit, or the positive voltage is applied to the P well of the load circuit A, and a forward current flows due to the PN junction. Therefore, the voltage levels of the input and output terminals of the switching circuit have the same positive voltage or the same negative voltage.

The following modifications or applications of the above-described embodiments of the invention can be made.

A volatile memory circuit may be used instead of the non-volatile memory circuit 324. Alternatively, a known rewritable non-volatile element may be used instead of the non-volatile memory circuit 324. For example, a system including the semiconductor device may be operated in the high-speed mode or the low-speed mode. For example, a CPU, an MCU, or a DSP device is operated in the high-speed mode or the low-speed mode by, for example, the clock-up of the system defined by the BIOS, and a memory device is operated in the high-speed mode or the low-speed mode according to CAS latency or the frequency of a synchronization signal (external clock signal CLK). In general, when the semiconductor device is operated at a high speed, the leakage current of the semiconductor transistor increases and the noise of the semiconductor chip increases. It is preferable that the internal power voltage generating circuits and the load circuits that are most suitable for the characteristics of the internal voltage generating circuits and the characteristics of the load circuits in each semiconductor device be allocated in relation to the internal operation speed of the semiconductor device. Similarly, the internal operation speed of the semiconductor or the leakage current is changed in relation to the power voltage or the temperature of the semiconductor.

The control information of the switching circuit SW is set in the writable non-volatile element by the person (system manufacturer) who provides the semiconductor device in the system, the system user (the person who sets the BIOS), or the system (for example, a memory controller when the semiconductor device is a memory device, and the BIOS, an MCU, or a temperature sensor when the semiconductor device is the MCU).

The control information of the switching circuit SW is set in a volatile memory circuit (for example, a volatile register) by the system user (the person who sets the BIOS) or the system (for example, a memory controller when the semiconductor device is a memory device, and the BIOS, an MCU, or a temperature sensor when the semiconductor device is the MCU).

The characteristics of the load circuit A and the voltage generating circuit according to this embodiment are information unique to the person (chip manufacturer) who tests the semiconductor chip and are not opened to a semiconductor chip user (a chip user (for example, a system designer or a person who uses the semiconductor chip and the entire system other than the persons who actually control the semiconductor chip)). However, it is possible to solve the restrictions in opening the information by exchanging predetermined information between the chip manufacturer and the chip user. For example, the chip manufacturer sets a plurality of connection conditions of the switching circuit that is most suitable for the operation conditions a high-speed operation and a low-speed operation (or the temperature and the power voltage) on the basis of the characteristics of the load circuit A and the internal voltage generating circuit and transmits information on the connection conditions to the chip user in advance. The chip user stores the received information in the rewritable non-volatile memory circuit 324 or the volatile memory circuit of the semiconductor chip according to the use conditions of the semiconductor chip (for example, the speed or the temperature). The system manufacturer stores the information in the non-volatile memory circuit 324 when the semiconductor is provided in the system. After the system is manufactured, the BIOS or the system stores the information in the volatile memory circuit when the system starts up.

Therefore, the rewritable non-volatile memory circuit 324 or the volatile memory circuit of the semiconductor chip is connected to an external terminal of the semiconductor chip, and the connection information of the switching circuit input from the outside of the semiconductor chip to the rewritable non-volatile memory circuit 324 or the volatile memory circuit. The information is input before a general operation using the semiconductor chip. The system manufacturer inputs the connection information in a special write cycle that is not related to the general operation. After the system is manufactured, the connection information is input when the system starts up (when power is supplied to the semiconductor chip, after power is supplied to the semiconductor chip, or when a reset command or an initialization command is issued). The reset command includes a hardware reset command and a software reset command.

The control information of the switching circuit SW is stored in the memory circuit 324 in various forms of information. For example, the following information items are stored in the memory circuit 324: a binary code; information on a high temperature/a low temperature; information on a high speed/a low speed; information on the voltage value of the power voltage; and information obtained by encoding these information items.

In the above-described embodiment of the invention, the memory is given as an example, but the basic technical spirit of the invention is not limited thereto. For example, the invention may be applied to semiconductor devices other than the memory. The semiconductor device of the invention can be applied to all kinds of semiconductor products, such as a CPU (Central Processing Unit), MCU (Micro Control Unit), a DSP (Digital Signal Processor), an ASIC (Application Specific Integrated Circuit), and an ASSP (Application Specific Standard Circuit). In addition, the invention can be applied to semiconductor devices, such as a SOC (system on chip), an MCP (multi chip package), and POP (package on package). The circuit forms of the internal voltage generating circuit, the switching circuit, and the load circuit A are not limited to the above-described embodiment. For example, the internal voltage generating circuit is not limited to the charge pump circuit, but may be a DC-DC converter. In addition, the conduction types of the transistors used in the elements and the circuits according to the above-described embodiments and the conduction type of the semiconductor substrate may be reversed. The invention can be applied to various element structures. The semiconductor substrate is not limited to the P-type semiconductor substrate, but may be an N-type semiconductor substrate. Alternatively, the semiconductor substrate may be a semiconductor substrate with an SOI (Silicon on Insulator) structure or other semiconductor substrates.

The transistor of the semiconductor device according to the invention may be a field effect transistor (FET). In addition, various kinds of FETs, such as an MIS (Metal-Insulator Semiconductor) transistor and a TFT (Thin Film Transistor), may be used other than the MOS (Metal Oxide Semiconductor). Transistors (for example, bipolar transistors) other than the FET may be used in some of the components according to the invention. The NMOS transistor (N-channel MOS transistor) is a representative example of the first conduction-type transistor, and the PMOS transistor (P-channel MOS transistor) is a representative example of the second conduction-type transistor.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   first and second internal voltage generating circuits generating first and second voltages, respectively;
   first and second load circuits; and
   a switching circuit coupled to the first and second internal voltage generating circuits and the first and second load circuits and configured to take a selected one of first, second, third and fourth states, the first state being such that the first voltage is supplied to both of the first and second load circuits, the second state being such that the second voltage is supplied to both of the first and second load circuits, the third state being such that the first and second voltages are supplied to the first and second load circuits, respectively, and the fourth state being such that the second and first voltages are supplied to the first and second load circuits, respectively.

2. The semiconductor device according to claim 1 further comprising:
   a nonvolatile circuit that is programmed to supply the switching circuit with a control signal that controls the switching circuit to take the selected one of the first, second, third and fourth states.

3. The semiconductor device according to claim 1, the switching circuit comprises:
   first and second input terminals supplied with the first and second voltages, respectively;
   first and second output terminals connected to the first and second load circuits, respectively;
   a first transistor provided between the first input terminal and the first output terminal, and the first transistor maintaining an on-state in each of the first and third states;
   a second transistor provided between the first input terminal and the second output terminal, and the second transistor maintaining an on-state in each of the first and fourth states;
   a third transistor provided between the second input terminal and the first output terminal, and the third transistor maintaining an on-state in each of the second and fourth states; and
   a fourth transistor provided between the second input terminal and the second output terminal, and the fourth transistor maintaining an on-state in each of the second and third states.

4. The semiconductor devise according to claim 1, wherein each of the first and second voltages is a negative voltage, and the first and second voltages are different from each other.

5. A semiconductor device comprising:
   m of internal voltage generating circuits generating m of voltages, respectively, m being at least 2;
   n of load circuits, n being at least 2;
   a switching circuit coupled between the m of internal voltage generating circuits and the n of load circuits; and
   a control circuit configured to control the switching circuit to take a selected one of a plurality of connecting combinations, a first one of the connecting combinations being such that the n of load circuits are supplied respectively with different ones of the m of voltages, and a second one of the connecting combinations being such that each of the n of load circuits is supplied in common with a selected one of the m of voltages.

6. The device according to claim 5, wherein the connecting combinations includes a third one in which at least two of the n of load circuits are supplied in common with a selected one of the m of voltages with remaining one or ones of the n of load circuits being supplied with different one or ones of the m of voltages.

7. The device according to claim 6, wherein the switching circuit comprises m of input nodes supplied with respectively the m of voltages, n of output nodes coupled respectively to the n of load circuits, and m sets of transistor circuits each including n of transistors, the n of transistors in each of the m sets of transistor circuits being connected at first ends in common to an associated one of the m of input nodes and at second ends connected respectively to the n of output nodes.

8. The device according to claim 7, wherein a selected one of the n of transistors is turned ON in each of the m sets of transistor circuits.

9. The device according to claim 8, wherein the control circuit comprises a nonvolatile memory circuit that produces a control signal, the control signal being supplied to the switching circuit so that the selected one of the n of transistors is turned ON in each of the m sets of transistor circuits.

10. The device according to claim 9, wherein the nonvolatile memory circuit includes at least one of a fuse and an anti-fuse.

11. The device according to claim 5, wherein the m of voltages includes a first negative voltage and a second negative voltage that is different from the first negative voltage.

12. The device according to claim 6, wherein the m of voltages includes first, second and third negative voltages that are different from one another.

13. A method comprising:
    generating at a plurality of nodes a plurality of voltages for a plurality of load circuits;
    testing each of the load circuits while supplying each of the load circuits with each of the voltages through a switching circuit;
    determining, in response to a result of the testing, proper voltages to be supplied respectively to the load circuits from the voltages; and
    programming the switching circuit such that the load circuits are supplied respectively with the proper voltages that are determined by the determining.

14. The method according to claim 13, wherein the testing is carried out by making the switching circuit form electrical paths between each of the load circuits and selected one or ones of the nodes.

15. The method according to claim 13, wherein the programming includes writing a nonvolatile memory circuit with data indicative of a result of the determining.

16. The method according to claim 15, wherein the data causes the switching circuit to electrically connect each of the load circuits to a selected one of the nodes so that the load circuits are supplied with the proper voltages, respectively.

* * * * *